United States Patent
Tsorng et al.

(10) Patent No.: US 10,973,147 B1
(45) Date of Patent: Apr. 6, 2021

(54) ROTATABLE CABLE HOLDER MODULE

(71) Applicant: Quanta Computer Inc., Taoyuan (TW)

(72) Inventors: Yaw-Tzorng Tsorng, Taoyuan (TW); Chun Chang, Taoyuan (TW); Yi-Huang Chiu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/781,731

(22) Filed: Feb. 4, 2020

Related U.S. Application Data

(60) Provisional application No. 62/923,007, filed on Oct. 18, 2019.

(51) Int. Cl.
*H05K 7/14* (2006.01)
*H05K 7/20* (2006.01)

(52) U.S. Cl.
CPC ....... *H05K 7/1491* (2013.01); *H05K 7/20145* (2013.01); *H05K 7/20754* (2013.01)

(58) Field of Classification Search
CPC .................................................... H05K 7/14
See application file for complete search history.

(56) References Cited

U.S. PATENT DOCUMENTS

| | | | | |
|---|---|---|---|---|
| 5,551,079 | A * | 8/1996 | Panther | H04B 1/086 340/7.63 |
| 6,443,343 | B2 * | 9/2002 | Kamiya | A45F 5/02 224/269 |
| 2011/0267794 | A1 * | 11/2011 | Anderson | H05K 7/1401 361/810 |

\* cited by examiner

*Primary Examiner* — Jerry Wu
(74) *Attorney, Agent, or Firm* — Nixon Peabody LLP

(57) ABSTRACT

A cable holder for retaining cables in a system sled is disclosed. The cable holder includes a base bracket, a clip holder, a retention clip, and a releasable latch. The base bracket is couplable to the system sled. The clip holder is coupled to the base bracket via a hinge. The clip holder is configured to rotate relative to the base bracket, and around a rotational axis through the hinge between a first lowered position proximate to the system sled and a second raised position substantially distal from the system sled. The retention clip is coupled to the clip holder, and configured to retain a portion of the cables in the system sled. The releasable latch is operable to lock the clip holder into either the first lowered position or the second raised position.

18 Claims, 7 Drawing Sheets

ROTATABLE CABLE HOLDER MODULE

CROSS-REFERENCE TO RELATED APPLICATIONS

This application claims priority under 35 U.S.C. § 119 to U.S. Provisional Application No. 62/923,007, entitled "ROTATABLE CABLE HOLDER MODULE," and filed on Oct. 18, 2019. The contents of that application are hereby incorporated by reference in their entirety.

TECHNICAL FIELD

This disclosure relates generally to cable holders, and more particularly, to systems and methods for holding cables in a computing system using one or more rotatable cable holders.

BACKGROUND

A conventional system sled for a computer server can include various computer components, and a number of cables that allow external communication with the various computer components. Typically, a system sled has a standard width and a standard height. Due to the system sled's space limit, a portion of the cables is often placed above the various computer components, such as the air duct and/or the PCBA. Therefore, when performing maintenance and/or replacement of the various computer components in the sled, the cables need to be removed. Further, in some instances, the cables may even have to be disconnected to allow access to the computer components and then reconnected after maintenance.

Thus, a need exists for a system sled that allows for cables that pass above computer components needing maintenance and/or replacement to be quickly changed. The present disclosure is directed to solving these problems.

SUMMARY

According to some implementations of the present disclosure, a cable holder for retaining cables in a system sled is disclosed. The cable holder includes a base bracket, a clip holder, a retention clip, and a releasable latch. The base bracket is couplable to the system sled. The clip holder is coupled to the base bracket via a hinge. The clip holder is configured to rotate relative to the base bracket, and around a rotational axis through the hinge between a first lowered position proximate to the system sled, and a second raised position substantially distal from the system sled. The retention clip is coupled to the clip holder, and configured to retain a portion of the cables in the system sled. The releasable latch is operable to lock the clip holder into the first lowered position or the second raised position.

In some examples, the base bracket is couplable to the system sled via a fastener. In some examples, the clip holder is removably coupled to the retention clip via an aperture of the clip holder. In some examples, the clip holder is integral to the retention clip.

In some examples, the clip holder includes a first opening and a second opening. The releasable latch includes a protrusion. The protrusion of the releasable latch extends through the first opening of the clip holder in the first position of the clip holder. The protrusion of the releasable latch extends through the second opening of the clip holder in the second position of the clip holder. In some such examples, the protrusion of the releasable latch extends in a direction generally parallel to the rotational axis of the clip holder. In some such examples, the protrusion of the releasable latch extends generally tangential to an arc defined between the first opening and the second opening of the clip holder.

In some examples, the retention clip includes a V-shaped cantilever and a box having an open top. The V-shaped cantilever is configured to lock to the box upon inserting the V-shaped cantilever into the open top of the box.

According to some implementations of the present disclosure, a system sled includes a first wall, a second wall, a computing component, one or more cables, and a first cable holder. The second wall of the system sled is located opposite of the first wall of the system sled. The computing component is housed between the first wall and the second wall of the system sled. At least a portion of the one or more cables is positioned above the computing component. The first cable holder is coupled to the first wall of the system sled. The first cable holder is configured to retain at least one of the one or more cables. The first cable holder is operable to lock into either a lowered first orientation or a raised second orientation. In the lowered first orientation, the at least one of the one or more cables retained by the first cable holder overlaps the computing component.

In some examples, the computing component is removable. In some examples, the computing component includes at least one of a circuit board, a CPU, a memory, a heat sink, a plurality of cable connectors, a plurality of midplane connectors, an air baffle, an air duct, and a PCB.

In some examples, in the raised second orientation, the at least one of the one or more cables is lifted away from the computing component.

In some examples, the first wall of the system sled includes a second cable holder. The second cable holder is configured to retain at least one of the one or more cables. The second cable holder is further operable to lock into either a lowered first orientation or a raised second orientation. In the lowered first orientation, the at least one of the one or more cables retained by the second cable holder overlaps the computing component.

In some examples, the first cable holder includes a releasable latch. The releasable latch of the first cable holder is operable to lock both the first cable holder and the second cable holder into either the lowered first orientation or the raised second orientation.

According to some implementations of the present disclosure, a method for arranging cables during system maintenance is disclosed. The cables are placed above a computing component housed between two walls of a system sled. The computing component includes at least one of a circuit board, a CPU, a memory, a heat sink, a plurality of cable connectors, a plurality of midplane connectors, an air baffle, an air duct, and a PCB. A portion of the cables is secured into a retention clip of a cable holder. The cable holder is coupled to the system sled. The retention clip of the cable holder is configured to lock into either a lowered position or a raised position, using a releasable latch. The releasable latch of the cable holder is displaced. The retention clip is rotated from the lowered position to the raised position. The releasable latch of the cable holder is released, thereby locking the retention clip into the raised position, and pulling the cables away from the computing component housed within the system sled.

In some examples, the cable holder is installed on a first wall of the two walls of the system sled. In some examples, the retention clip is rotated from the raised position to the lowered position.

In some examples, the computing component includes at least one of a circuit board, a CPU, a memory, a heat sink, a plurality of cable connectors, a plurality of midplane connectors, an air baffle, an air duct, and a PCB.

In some examples, the system sled further includes a PCBA. The computing component housed within the system sled is removed, to perform maintenance to the PCBA or to replace the computing component.

In some examples, the computing component is the air baffle. The air baffle is removed to allow access to the PCB.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

Figure 1:
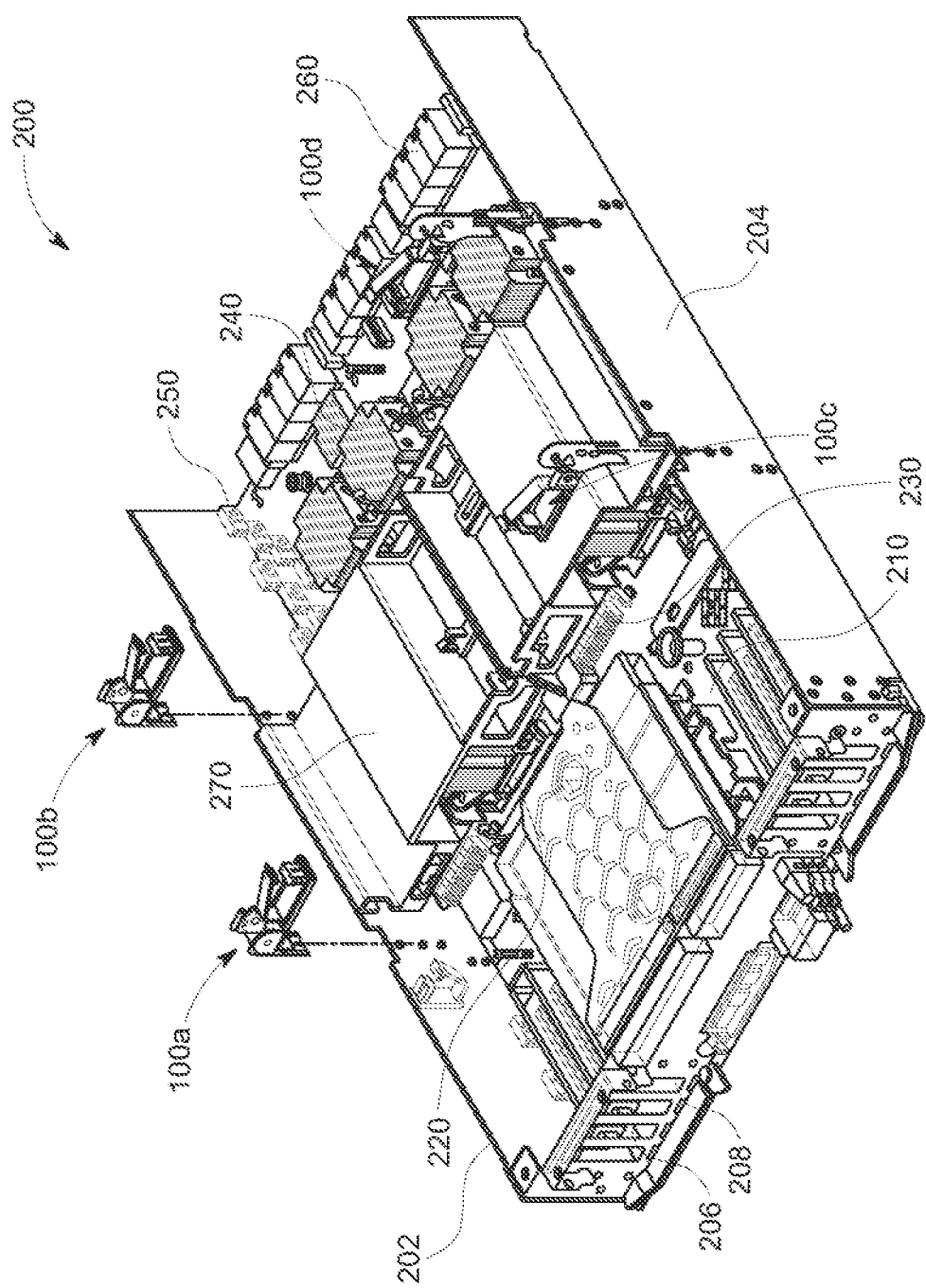
FIG. 1 is an axonometric view of a system sled receiving a plurality of cable holders, according to some implementations of the present disclosure.

The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

The present inventions can be embodied in many different forms. Representative embodiments are shown in the drawings, and will herein be described in detail. These embodiments are examples or illustrations of the principles of the disclosure but are not intended to limit its broad aspects. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

A conventional system sled can include various computer components and a number of cables. Typically, the system sled has a standard width and a standard height. Due to the system sled's space limit, a portion of the cables is often placed above a portion of the various computer components, such as the air duct and/or the PCBA. Therefore, when performing maintenance and/or replacement of the various computer components, the cables need to be removed. Further, in some instances, the cables may even have to be disconnected and reconnected.

The present disclosure provides a system sled that allows for cables that pass above computer components that need maintenance and/or replacement to be quickly changed. In some implementations of the present disclosure, the system sled includes one or more rotatable cable holders. The one or more rotatable cable holders enable an operator to quickly change the route of the cables that pass above the various computer components. In some examples, the cable holders can rotate from a lowered position to a raised position, thereby lifting the cables away from the computer components. Therefore, the operator need not remove the cables to gain access to the various computer components. In some examples, the air duct can be dissembled while the cable holders are rotated to the raised position, and the operator can then perform maintenance to the PCBA or replace any modules in the system sled.

Referring generally to FIG. 1, a system sled 200 includes a first wall 202, a second wall 204, and a mainboard 206 attached to the walls 202, 204. In some examples, the mainboard 206 includes a PCBA 208. As shown, several computing components are mounted on the mainboard or the PCBA 208, and between the walls 202, 204. The computing components can include a circuit board 210, a CPU 220, a memory 230, a heat sink 240, cable connectors 250, midplane connectors 260, an air baffle (or any other covering) 270, or the like, or any combination thereof. Other components such as circuit cards, fans, power supply units, network interface cards, etc., may also be mounted in the system sled 200.

Cable holders 100a, 100b are installable to the first wall 202. Cable holders 100c, 100d are installable to the second wall 204. Therefore, in some examples, the cable holders 100a-100d are installable on either side of the computing components. Moreover, each of the cable holders 100a-100d is configured to lock into either a first (e.g., lowered) position proximate to the system sled 200, or a second (e.g., raised) position substantially distal from the system sled 200.

Figure 2:
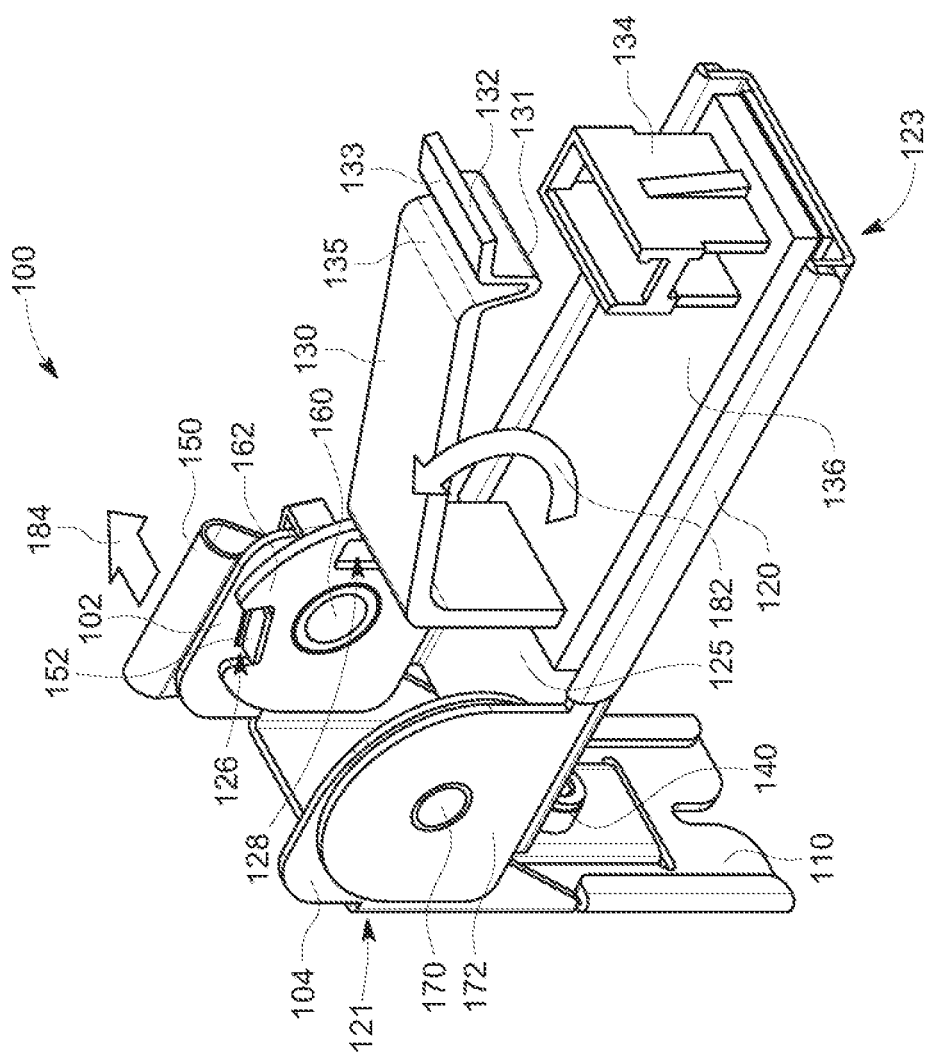
FIG. 2 is an axonometric view of an example cable holder in a lowered position, according to some implementations of the present disclosure.
Figure 3A:
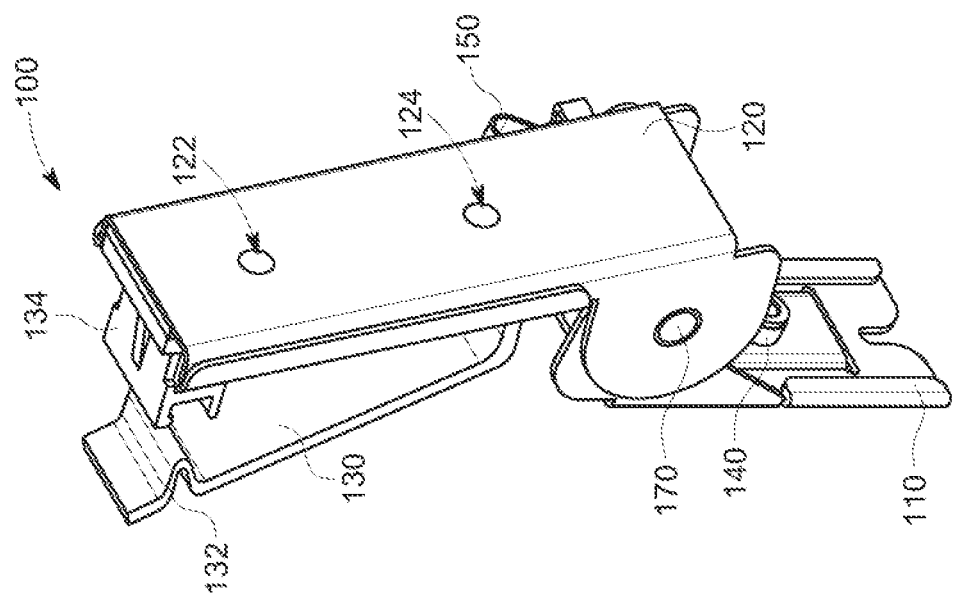
FIG. 3A is an axonometric view of the example cable holder in a raised position, according to some implementations of the present disclosure.
Figure 3B:
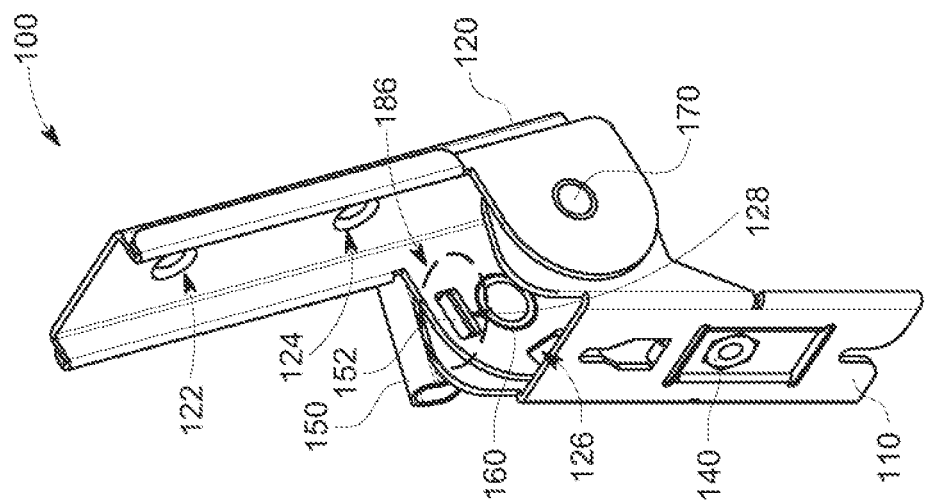
FIG. 3B is an isolated view of the base bracket and the clip holder of the cable holder in the raised position, according to some implementations of the present disclosure.

Referring now to FIGS. 2 and 3A-3B, an example cable holder 100 for retaining cables in a system sled is depicted. More specifically, FIG. 2 is an axonometric view of the example cable holder in a lowered position, according to some implementations of the present disclosure. FIG. 3A is an axonometric view of the cable holder in a raised position, according to some implementations of the present disclosure. FIG. 3B is an isolated view of the base bracket and the clip holder of the cable holder in the raised position, according to some implementations of the present disclosure.

As depicted in FIG. 2, the cable holder 100 includes a base bracket 110, a clip holder 120 rotatably coupled to the base bracket 110, a retention clip (e.g., a cable clip) 130 coupled to the clip holder 120, and a releasable latch 150 configured to engage the clip holder 120. The base bracket 110 is couplable to the system sled 200 (FIG. 1) via a fastener 140. In this example, the fastener 140 is a bolt. The fastener 140 may also be any suitable fastening mechanism such as a cap screw, a socket, a hex key, a nut, a threaded rod, a structural fastener, a machine screw, a U-bolt, a masonry anchor, a self-drilling screw, a pin, a rivet, a washer, a set screw, a tapping screw, a military fastener, a stainless steel fastener, a construction fastener, a specialty fastener, a welding fastener, a precision fastener, a marine fastener, a metric fastener, a tamper-proof security fastener, or the like, or any combination thereof. However, it is also contemplated that the base bracket 110 is couplable to the system sled 200 via any suitable coupling mechanisms, permanently, semi-permanently, or temporarily.

The clip holder 120 includes a generally rectangular body 125. The rectangular body 125 of the clip holder 120 has a proximal end 121, and an opposite distal end 123. At the proximal end 121, the clip holder 120 has two protruding tabs 162 and 172 extending perpendicularly from the rectangular body 125. The two protruding tabs 162, 172 of the clip holder 120 support the hinges 160, 170, respectively. The clip holder 120 is coupled to the base bracket 110, via the first hinge 160 and the second hinge 170.

The base bracket 110 includes two parallel panels 102 and 104. The first panel 102 holds the first hinge 160, and the second panel 104 holds the second hinge 170. An interior surface of the first panel 102 is in contact with the first protruding tab 162 of the clip holder 120. An opposite (e.g., exterior) surface of the first panel 102 holds the latch 150. An exterior surface of the second panel 104 is in contact with the second protruding tab 172 of the clip holder 120.

The clip holder 120 is configured to rotate, relative to the base bracket 110, in a circular direction 182 and/or its opposite direction. Further, the clip holder 120 is configured to rotate around a rotational axis through the hinges 160 and 170. In some examples, the first protruding tab 162 of the clip holder 120 includes a first opening/slot 126 and a second opening/slot 128 spaced radially from the first hinge 160. Each of the first opening 126 and the second opening 128 is configured to engage a protrusion 152 of the releasable latch 150. In some examples, the protrusion 152 of the latch 150 extends in a direction generally parallel to the rotational axis of the clip holder 120. Additionally or alternatively, the protrusion 152 of the latch 150 extends generally tangential to an arc defined between the first opening 126 and the second opening 128 of the clip holder 120.

As depicted in FIG. 2, in a first (e.g., lowered) position of the clip holder 120, the protrusion 152 of the latch 150 extends through the first opening 126 of the clip holder 120, thereby substantially preventing the clip holder 120 from rotating relative to the base bracket 110. However, the latch 150 (and in turn, the protrusion 152) can be displaced (e.g., pulled) away from the clip holder 120 in a direction 184. Upon such displacement of the latch 150, the clip holder 120 is free to rotate around the rotational axis to the first position or the second position.

In some examples, the latch 150 is biased inward with regard to the first protruding tab 162 of the clip holder 120. Therefore, upon aligning the protrusion 152 of the latch 150 with the first opening 126 or the second opening 128, the latch 150 can be released, thereby allowing the protrusion 152 to extend through the first opening 126 or the second opening 128. As such, the latch 150 is operable to lock the clip holder 120 into the first position (shown in FIG. 2) or the second position (shown in FIGS. 3A-3B).

As depicted in FIG. 2, the retention clip 130 includes a cantilever clip 132, a box 134, and a generally rectangular body 136. The generally rectangular body 136 of the retention clip 130 is coupled directly to the generally rectangular body 125 of the clip holder 120. The cantilever clip 132 is anchored at a proximal end of the generally rectangular body 136 of the retention clip 130. A first portion of the cantilever clip 132 extends upward from the generally rectangular body 136. A second portion of the cantilever clip 132 extends substantially parallel to the generally rectangular body 136, and toward the box 134 at a distal end of the generally rectangular body 136.

The cantilever clip 132 forms a U-shape or V-shape with an apex 131, a release arm 133, and an anchor arm 135. The material from which the cantilever clip 132 is formed should be sufficiently resilient, such that release following manual compression between the release arm 133 and the anchor arm 135, allows the cantilever clip 132 to rebound to its pre-compressed configuration. The box 134 is made of a rigid material, such as Nylon 66 or any suitable plastic. The box 134 is strong enough to retain engagement of the cantilever clip 132 during use.

The apex 131 is dimensioned such that it is insertable into an open top of the box 134. The V-shape configuration of the cantilever clip 132 is dimensioned such that, upon insertion into the box 134, the release arm 133 and the anchor arm 135 contact the walls defining the open top of the box 134. Farther insertion requires compression of the arms 133, 135, thereby tightening the V-shape. Tightening the V-shape ensures that the cantilever clip 132 remains engaged (e.g., locked) with the box 134.

To disengage the cantilever clip 132 from the box 134, the release arm 133 is depressed. For example, pressure may be applied with a thumb, which covers a top wall of the release arm 133. Such depression should be applied at an oblique angle to the plane of the walls defining the open top of the box 134.

Referring now to FIG. 3A, like elements are labeled with identical reference numbers as those elements in FIG. 2. As depicted in FIG. 3A, the clip holder 120 further includes a first aperture 122, and a second aperture 124. The retention clip 130 is removably coupled to the clip holder 120 via the apertures 122, 124. The apertures 122, 124 can be used in conjunction with any suitable fasteners, such as, for example, short nails to fasten the retention clip 130 to the clip holder 120. Other suitable fasteners may include a bolt, a cap screw, a socket, a hex key, a nut, a threaded rod, a structural fastener, a machine screw, a U-bolt, a masonry anchor, a self-drilling screw, a pin, a rivet, a washer, a set screw, a tapping screw, a military fastener, a stainless steel fastener, a construction fastener, a specialty fastener, a welding fastener, a precision fastener, a marine fastener, a metric fastener, a tamper-proof security fastener, or the like, or any combination thereof. Additionally, or alternatively, in some implementations, the clip holder 120 is integral and/or permanently affixed to the retention clip 130.

Referring now to FIG. 3B, like elements are labeled with identical reference numbers as those elements in FIG. 2 and/or FIG. 3A. As depicted in FIG. 3B, the clip holder 120 is in the second (e.g., raised) position, where the protrusion 152 of the latch 150 extends through the second opening 128 of the clip holder 120 (see the circled part 186). The clip holder 120 is substantially prevented from rotating relative to the base bracket 110.

Figure 4:
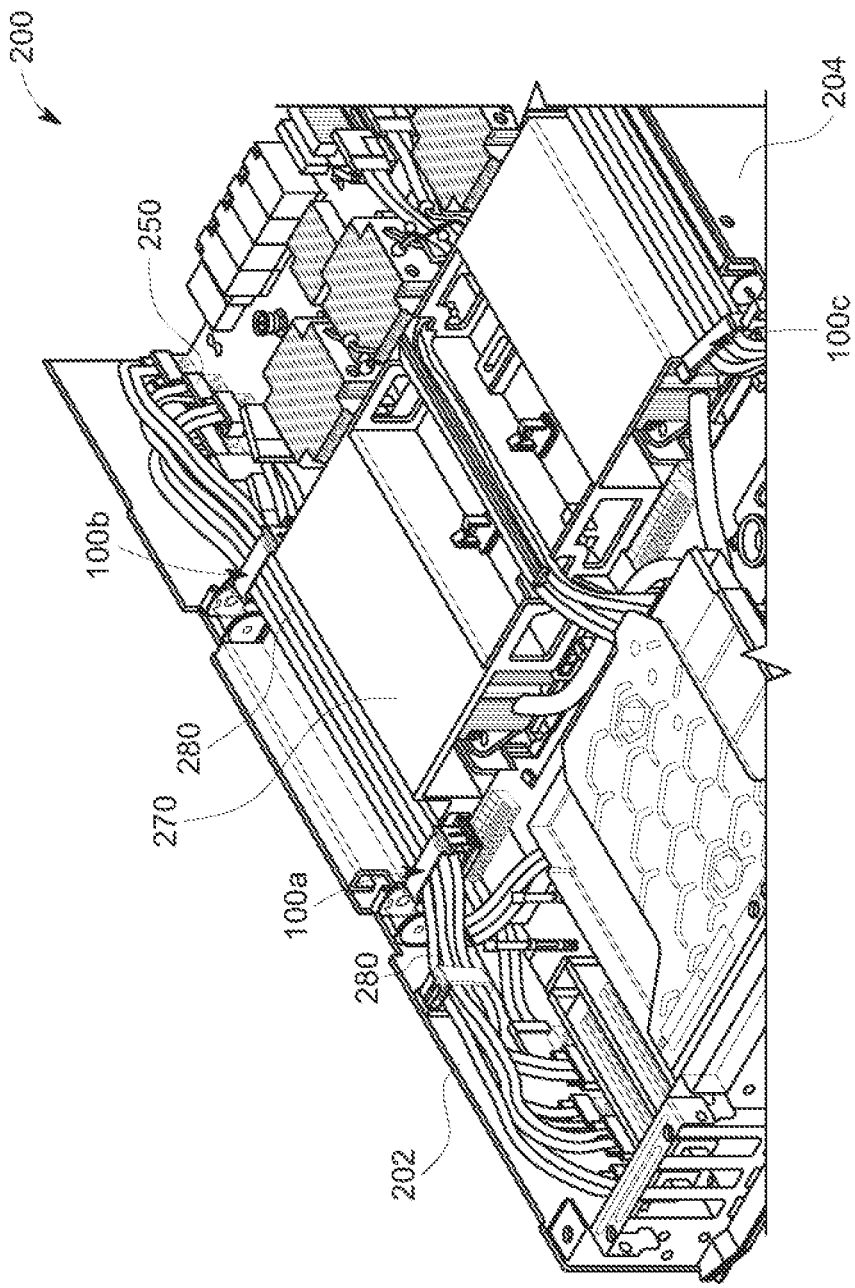
FIG. 4 is an axonometric view of a system sled having a plurality of cable holders in a lowered position, according to some implementations of the present disclosure.

Referring now to FIG. 4, an axonometric view of the system sled 200 is depicted, according to some implementations of the present disclosure. The cable holders 100a, 100b are installed on the first wall 202 of the system sled 200, and locked in the lowered position as shown in detail in FIG. 2. The ends of the cables 280 are connected to the corresponding cable connectors 250, and retained/secured in the cable holders 100a, 100b. A portion of the cables 280 is positioned and/or placed above the removable air baffle 270, while the cable holders 100a, 100b are locked in the lowered position.

Figure 5:
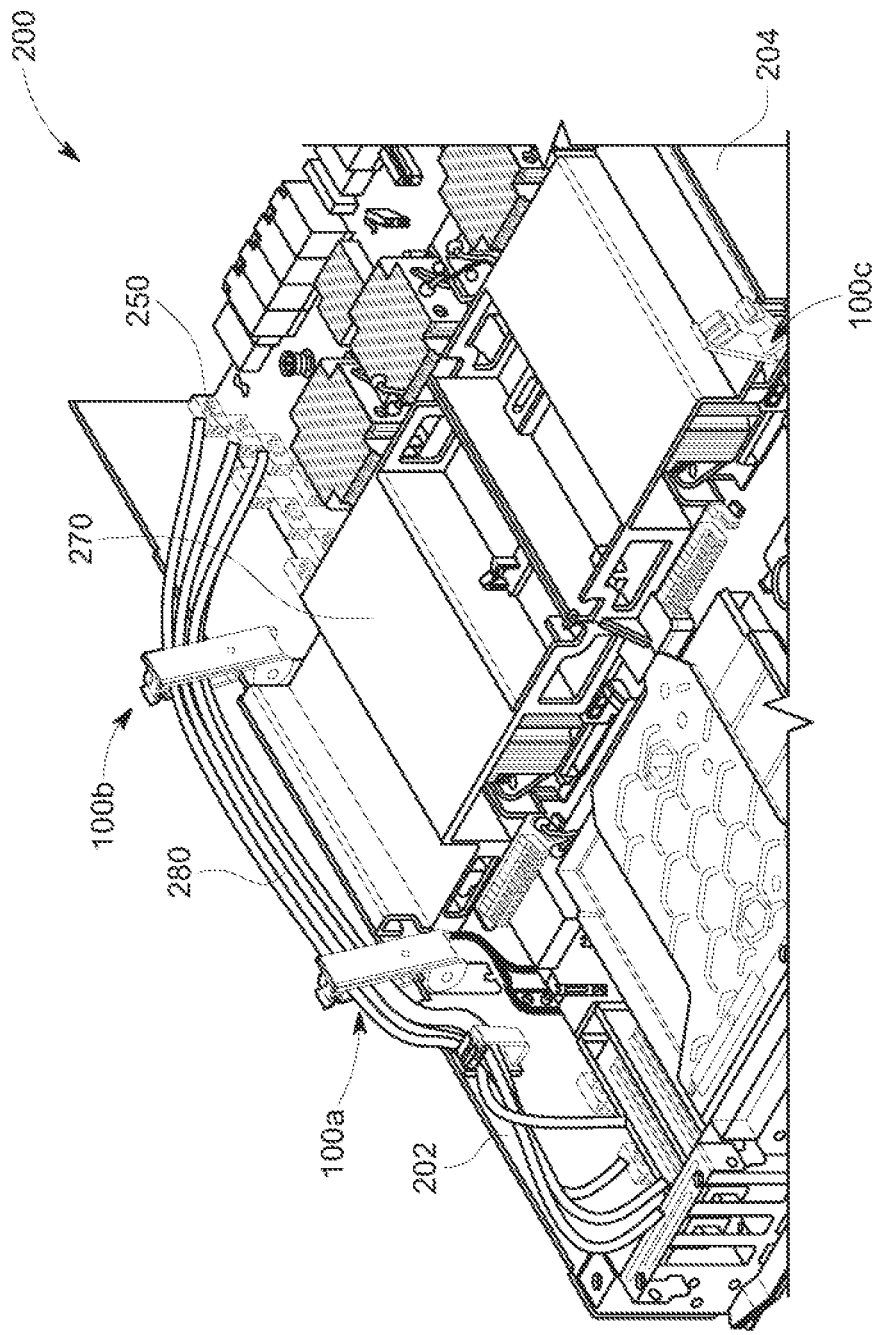
FIG. 5 is an axonometric view of a system sled having a plurality of cable holders in a raised position, according to some implementations of the present disclosure.

Referring now to FIG. 5, an axonometric view of the system sled 200 is depicted, according to some implementations of the present disclosure. The system sled 200 of FIG. 5 is similar to, or the same as, the system sled 200 of FIG. 4, except that cable holders 100a, 100b on the first wall 202 in FIG. 5 are locked in the raised position. When raised, the cables 280 are lifted away from the air baffle 270. As shown in detail in FIG. 2, raising the cables secured by each of the cable holders 100a, 100b involves displacing the latch 150 along the direction 184. The retention clip 130, carried by the clip holder 120, is then allowed to rotate from the lowered position to the raised position. Once the protrusion 152 aligns with the second opening 128 of the clip holder 120, the latch 150 of the cable holder 100 is released. The protrusion 152 of the latch 150 then extends through the second opening 128 of the clip holder 120, which in turn locks the retention clip 130 into the raised position shown in FIG. 5. The cables 280 thus are positioned away from the air baffle 270, thereby allowing access to the components of the system sled 200.

Figure 6:
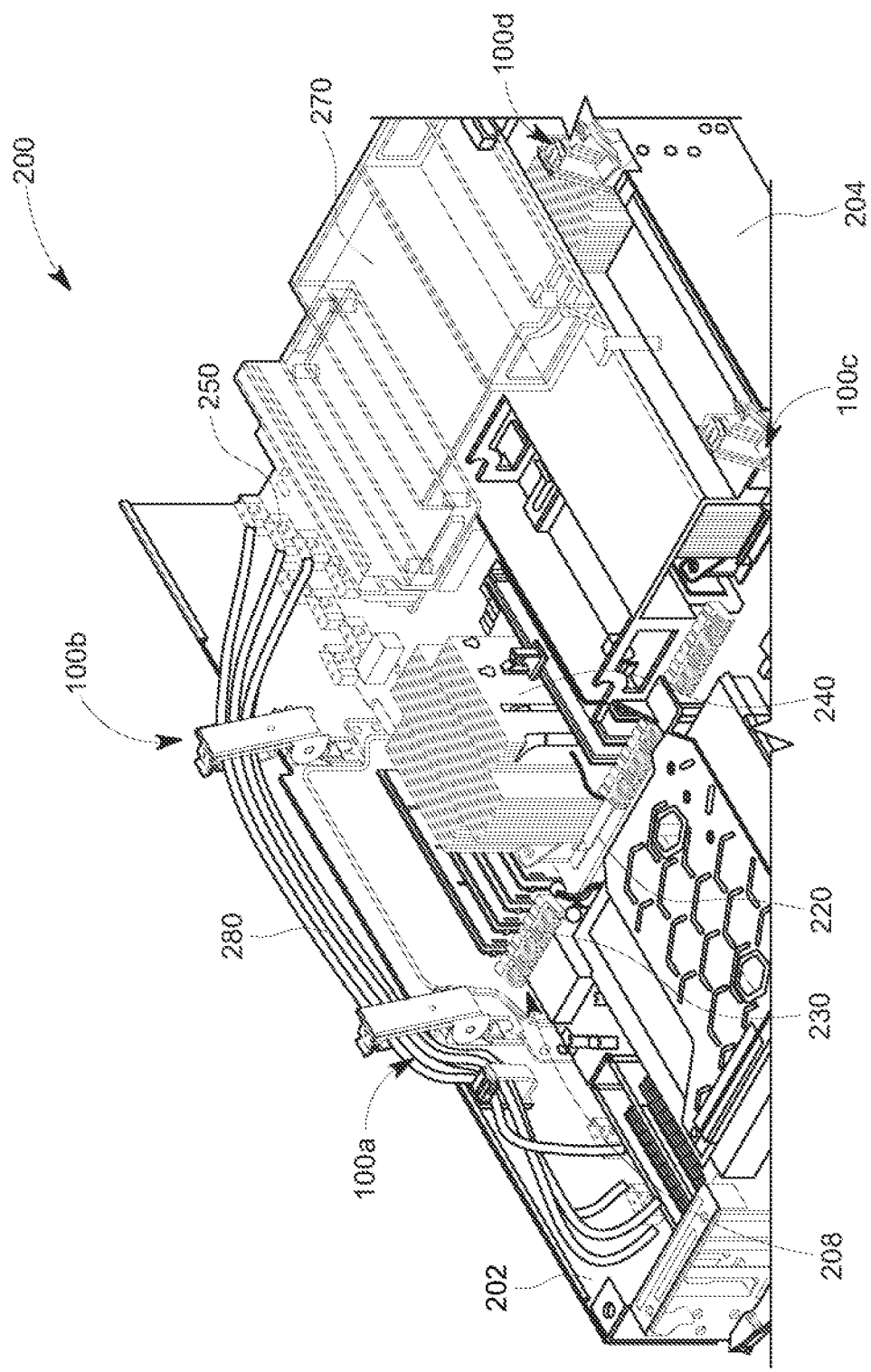
FIG. 6 is an axonometric view of a system sled having a plurality of cable holders in a raised position and an air baffle being removed, according to some implementations of the present disclosure.

Referring now to FIG. 6, an axonometric view of the system sled 200 is depicted, according to some implementations of the present disclosure. The air baffle 270 in FIG. 5 has been removed from its original location. The removal of the air baffle 270 is facilitated because the cables 280 are raised out of the way. When raised out of the way, the cables 280 do not interfere with the air baffle 270 being removed from the top of the system sled 200. In this manner, components under the air baffle 270, such as heat sink 240, CPU 220, cards in DIM NI memory slots 230, etc., may be accessed. In some examples, once the air baffle 270 is removed, an operator of the system sled 200 can perform maintenance of the PCBA 208, replace a computing component under the air baffle 270, or replace/clean the air baffle 270 itself.

While the cable holder 100 is described and depicted in FIG. 2 and FIGS. 3A-3B as having two hinges 160 and 170, it is contemplated that the cable holder 100 can include any suitable number of hinges, such as a single hinge, three hinges, four hinges, five hinges, etc. While the clip holder 120 is described and depicted in FIGS. 3A-3B as having two apertures 122 and 124, it is contemplated that the clip holder 120 can include any suitable number of apertures, such as a single aperture, three apertures, four apertures, five apertures, etc.

While the system sled 200 is depicted in FIG. 1 as having two of the same cable holders 100a, 100b installable to the first wall 202, the cable holders 100a, 100b can differ from each other. For example, in some implementations, the system sled can include two cable holders coupled to a same wall of the system sled (e.g., the cable holders 100a, 100b coupled to the first wall 202 of the system sled 200). Each of the two cable holders is configured to retain and/or secure a different portion of a same plurality of cables in the system sled. A first cable holder of the two cable holders (e.g., the cable holder 100a) includes a latch (similar to, or the same as, the latch 150 of the cable holder 100). The latch of the first cable holder is operable to lock both of the two cable holders into either the first (e.g., lowered) orientation or the second (e.g., raised) orientation. Further, a single latch can operate to allow rotation of more than one cable holder. Even further, in some examples, rotating a first cable holder may cause rotation of a second cable holder.

While the example implementations illustrated herein relate to one or more cable holders coupled to one or more side walls of the system sled, the present disclosure relates to any suitable number of cable holders couplable to any suitable computer module. Further, while various examples are disclosed herein depicting the one or more cable holders installed on the one or more side walls of the system sled, a cable holder, according to the present disclosure, can be otherwise installed in other locations of the computer module, or may be installed on an adjacent structure to engage with the computer module.

While various embodiments of the present invention have been described above, it should be understood that they have been presented by way of example only, and not limitation. Numerous changes to the disclosed embodiments can be made in accordance with the disclosure herein, without departing from the spirit or scope of the invention. Thus, the breadth and scope of the present invention should not be limited by any of the above described embodiments. Rather, the scope of the invention should be defined in accordance with the following claims and their equivalents.

Although the disclosure has been illustrated and described with respect to one or more implementations, equivalent alterations and modifications will occur to others skilled in the art upon the reading and understanding of this specification and the annexed drawings. In addition, while a particular feature of the disclosure may have been disclosed with respect to only one of several implementations, such feature may be combined with one or more other features of the other implementations as may be desired and advantageous for any given or particular application.

The terminology used herein is for the purpose of describing particular examples only and is not intended to be limiting of the disclosure. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this disclosure belongs. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

What is claimed is:

1. A cable holder for retaining cables in a system sled, comprising:
   a base bracket couplable to the system sled;
   a clip holder coupled to the base bracket via a hinge located on two protruding tabs extending perpendicularly from a rectangular body, the clip holder being configured to rotate relative to the base bracket and around a rotational axis, through the hinge between a first lowered position proximate to the system sled and a second raised position substantially distal from the system sled;

a retention clip coupled to the rectangular body of the clip holder and configured to retain a portion of the cables in the system sled; and a releasable latch having a protrusion operable to engage a first and second openings located on one of the protruding tabs to lock the clip holder into either the first lowered position or the second raised position respectively.

2. The cable holder of claim 1, wherein the base bracket is couplable to the system sled via a fastener.

3. The cable holder of claim 1, wherein the clip holder is removably coupled to the retention clip via an aperture of the clip holder.

4. The cable holder of claim 1, wherein the clip holder is integral to the retention clip.

5. The cable holder of claim 1, wherein the protrusion of the releasable latch extends in a direction generally parallel to the rotational axis of the clip holder.

6. The cable holder of claim 1, wherein the protrusion of the releasable latch extends generally tangential to an arc defined between the first opening and the second opening of the clip holder.

7. The cable holder of claim 1, wherein the retention clip includes a V-shaped cantilever and a box having an open top, and wherein the V-shaped cantilever is configured to lock to the box upon inserting the V-shaped cantilever into the open top of the box.

8. A system sled, comprising:
a first wall;
a second wall opposite the first wall;
a computing component housed between the first wall and the second wall of the system sled;
one or more cables, at least a portion of the one or more cables being positioned above the computing component; and
a first cable holder coupled to the first wall of the system sled, the first cable holder being configured to retain at least one of the one or more cables, the first cable holder comprising:
 a base bracket couplable to the system sled;
 a clip holder coupled to the base bracket via a hinge located on two protruding tabs extending perpendicularly from a rectangular body, the clip holder being configured to rotate relative to the base bracket and around a rotational axis, through the hinge between a first lowered position proximate to the system sled and a second raised position substantially distal from the system sled;
 a retention clip coupled to the rectangular body of the clip holder and configured to retain a portion of the cables in the system sled; and
 a releasable latch having a protrusion operable to engage a first and second openings located on one of the protruding tabs and operable to lock the first cable holder into either a lowered first orientation overlapping the computing component or a raised second orientation.

9. The system sled of claim 8, wherein the computing component is removable.

10. The system sled of claim 8, wherein the computing component includes at least one of a circuit board, a CPU, a memory, a heat sink, a plurality of cable connectors, a plurality of midplane connectors, an air baffle, an air duct, and a PCB.

11. The system sled of claim 8, wherein in the raised second orientation, the at least one of the one or more cables is lifted away from the computing component.

12. The system sled of claim 8, wherein the first wall of the system sled includes a second cable holder being configured to retain at least one of the one or more cables and operable to lock into either a lowered first orientation overlapping the computing component or a raised second orientation.

13. A method for arranging cables during system maintenance, the method comprising:
placing the cables above a computing component housed between two walls of a system sled;
securing a portion of the cables into a retention clip of a cable holder coupled to the system sled, the retention clip being configured to lock into either a lowered position or a raised position using a releasable latch that engages with a first and second openings located on a protruding tab extending perpendicularly from a rectangular body of the retention clip;
displacing the releasable latch of the cable holder;
rotating the retention clip from the lowered position to the raised position through a hinge located on the protruding tab; and
releasing the releasable latch of the cable holder, thereby locking the retention clip into the raised position and pulling the cables away from the computing component housed within the system sled.

14. The method of claim 13, further comprising installing the cable holder on a first wall of the two walls of the system sled.

15. The method of claim 13, further comprising rotating the retention clip from the raised position to the lowered position.

16. The method of claim 13, wherein the computing component includes at least one of a circuit board, a CPU, a memory, a heat sink, a plurality of cable connectors, a plurality of midplane connectors, an air baffle, an air duct, and a PCB.

17. The method of claim 16, wherein the system sled further includes a PCBA, and wherein the method further includes removing the computing component housed within the system sled to perform maintenance to the PCBA or to replace the computing component.

18. The method of claim 16, wherein the computing component is the air baffle, and wherein the air baffle is removed to allow access to the PCB.

\* \* \* \* \*